United States Patent
Keilson et al.

(10) Patent No.: US 10,303,385 B1
(45) Date of Patent: May 28, 2019

(54) UPDATING BLOCK RANDOM ACCESS MEMORY CONTENTS USING MEMORY EMULATION

(71) Applicant: Xilinx, Inc., San Jose, CA (US)

(72) Inventors: Michael Keilson, Boulder, CO (US); Stephen P. Rozum, Loveland, CO (US); Ryan A. Linderman, Longmont, CO (US); Pradip Kar, San Jose, CA (US)

(73) Assignee: XILINX, INC., San Jose, CA (US)

( * ) Notice: Subject to any disclaimer, the term of this patent is extended or adjusted under 35 U.S.C. 154(b) by 275 days.

(21) Appl. No.: 15/451,967

(22) Filed: Mar. 7, 2017

(51) Int. Cl.
*G06F 3/06* (2006.01)
*G06F 17/50* (2006.01)
*G11C 8/16* (2006.01)

(52) U.S. Cl.
CPC .......... *G06F 3/0632* (2013.01); *G06F 3/0604* (2013.01); *G06F 3/0638* (2013.01); *G06F 3/0673* (2013.01); *G06F 17/505* (2013.01); *G06F 17/5054* (2013.01); *G06F 3/0607* (2013.01); *G06F 3/0689* (2013.01); *G06F 17/5022* (2013.01); *G06F 2217/86* (2013.01); *G11C 8/16* (2013.01)

(58) Field of Classification Search
CPC ............ G06F 17/5022; G06F 2217/86; G06F 3/0607; G06F 3/0689; G11C 8/16
USPC .......................................................... 711/170
See application file for complete search history.

(56) References Cited

U.S. PATENT DOCUMENTS

| | | | | |
|---|---|---|---|---|
| 4,862,347 A * | 8/1989 | Rudy | .................. | G06F 17/5022 703/14 |
| 5,325,365 A * | 6/1994 | Moore | .................. | G06F 11/261 714/29 |
| 5,581,695 A * | 12/1996 | Knoke | ................ | G06F 11/3656 714/28 |
| 5,802,003 A * | 9/1998 | Iadanza | .................... | G11C 8/16 365/189.08 |
| 6,157,570 A * | 12/2000 | Nachumovsky | .... | G11C 11/5671 257/E27.103 |
| 6,904,400 B1 * | 6/2005 | Peri | ....................... | G11C 16/102 365/185.3 |
| 8,112,267 B2 * | 2/2012 | Nemecek | .............. | G06F 11/261 703/28 |
| 2005/0040850 A1 * | 2/2005 | Schultz | ............... | G06F 15/7867 326/41 |
| 2008/0306723 A1 * | 12/2008 | De Annbroggi | ...... | G11C 11/005 703/21 |

* cited by examiner

*Primary Examiner* — Mardochee Chery
(74) *Attorney, Agent, or Firm* — Kevin T. Cuenot

(57) ABSTRACT

Modifying initialization data for a memory array of a circuit design can include providing, using a processor, portions of an incoming stream of data for initializing the memory array to emulation objects of a memory array emulator. The memory array emulator is configured to emulate an implementation of the memory array and the emulation objects represent block random access memories (block RAMs) of the memory array. Using the processor, the data can be formatted using the emulation objects to generate initialization data, wherein the data is formatted based upon configuration settings of the block RAMs emulated by the respective emulation objects. A configuration bitstream can be updated, using the processor, with the initialization data.

20 Claims, 4 Drawing Sheets

UPDATING BLOCK RANDOM ACCESS MEMORY CONTENTS USING MEMORY EMULATION

TECHNICAL FIELD

This disclosure relates to integrated circuits (ICs) and, more particularly, to updating contents of block random access memories of a programmable IC using memory emulation.

BACKGROUND

Integrated circuits (ICs) can be implemented to perform a variety of functions. Some ICs can be programmed to perform specified functions. One example of an IC that can be programmed is a field programmable gate array (FPGA). Another example of an IC that can be programmed is one that includes at least some portion of FPGA circuitry. FPGA circuitry typically includes an array of programmable tiles. Examples of programmable tiles (e.g., circuit blocks) include input/output blocks (IOBs), configurable logic blocks (CLBs), dedicated blocks of random access memory (or "block RAMs"), multipliers, digital signal processing blocks (DSPs), processors, clock managers, delay lock loops (DLLs), and so forth.

The programmable tiles typically include both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that may include, for example, function generators, registers, arithmetic logic, and so forth.

The programmable interconnect and programmable logic circuitries are typically programmed by loading a stream of configuration data into internal configuration memory cells of the IC that define how the programmable elements included therein are configured. The configuration data can be read from memory (e.g., from an external PROM) or written into the programmable IC by an external device. The collective states of the individual memory cells then determine the function of the FPGA circuitry of the IC.

The initial contents of block RAMs of a circuit design are specified by the configuration data that is loaded into the IC. Thus, any change to the contents of the block RAMs upon implementation of the circuit design within the IC must be updated in the configuration data loaded into the IC.

SUMMARY

One or more embodiments are directed to methods of modifying initialization data for a memory array of a circuit design. In one aspect, a method can include providing, using a processor, portions of an incoming stream of data for initializing the memory array to emulation objects of a memory array emulator. The memory array emulator is configured to emulate an implementation of the memory array and the emulation objects represent block random access memories (block RAMs) of the memory array. The method can include formatting, using the processor, the data using the emulation objects to generate initialization data, wherein the data is formatted based upon configuration settings of the block RAMs emulated by the respective emulation objects. The method can also include updating, using the processor, a configuration bitstream with the initialization data.

One or more embodiments are directed to systems for modifying initialization data for a memory array of a circuit design. In one aspect, a system includes a processor configured to initiate executable operations. The executable operations include providing portions of an incoming stream of data for initializing the memory array to emulation objects of a memory array emulator. The memory array emulator is configured to emulate an implementation of the memory array and the emulation objects represent block RAMs of the memory array. The executable operations can include formatting the data using the emulation objects to generate initialization data, wherein the data is formatted based upon configuration settings of the block RAMs emulated by the respective emulation objects. The executable operations can also include updating a configuration bitstream with the initialization data.

One or more embodiments are directed to computer program products for modifying initialization data for a memory array of a circuit design. In one aspect, a computer program product includes a computer readable storage medium having program instructions embodied therewith. The program instructions are executable by a processor to cause the processor to initiate operations including providing, using the processor, portions of an incoming stream of data for initializing the memory array to emulation objects of a memory array emulator. The memory array emulator is configured to emulate an implementation of the memory array and the emulation objects represent block RAMs of the memory array. The program instructions are executable to cause the processor to initiate operations including formatting, using the processor, the data using the emulation objects to generate initialization data, wherein the data is formatted based upon configuration settings of the block RAMs emulated by the respective emulation objects, and updating, using the processor, a configuration bitstream with the initialization data.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
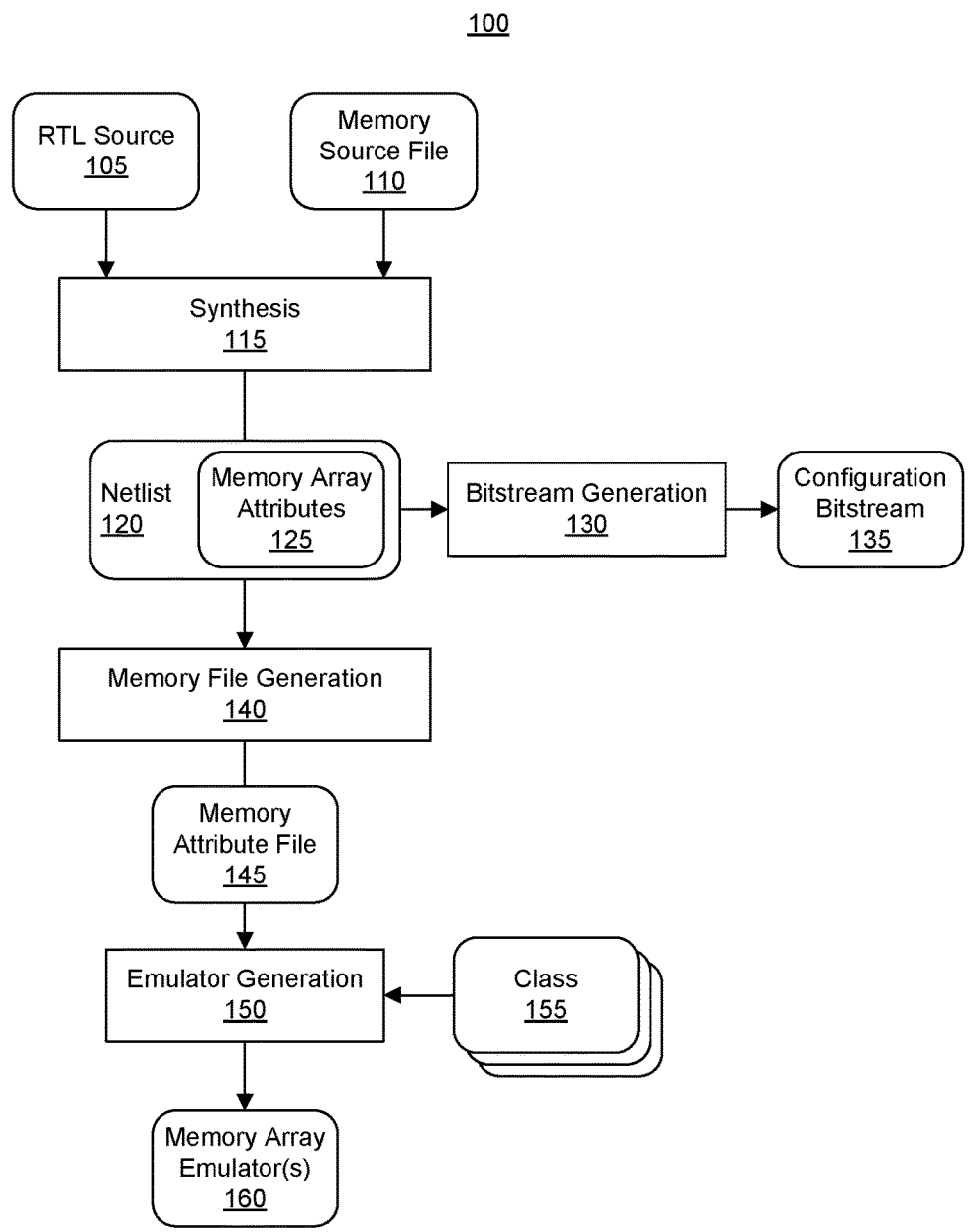
FIG. 1 illustrates an example process for generating a memory array emulator.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to updating contents of block random access memories (hereafter "block RAMs") of an IC using memory emulation. The data used to initialize block RAMs are specified by the particular circuit design that is loaded into an IC. For example, upon loading a circuit design into the IC, the block RAMs of the IC utilized by the circuit design are written, or initialized, with initialization data included in the configuration bitstream for the circuit design. In the event that the initialization data stored in one or more block RAMs are to be modified, the circuit design is updated to specify the newer or updated initialization data for the block RAMs. Appreciably, data stored within block RAMs may be modified as the IC begins to operate. Still, to effectuate a change in the data stored in the block RAMs at the time of initialization, e.g., loading of the circuit design and implementation thereof in the IC, the configuration bitstream is modified to specify the updated data.

Accordingly, one or more embodiments described herein facilitate the modification and/or updating of initialization data for one or more block RAMs. More particularly, the inventive arrangements described herein are capable of using memory emulation to modify a configuration bitstream for a circuit design to update the initialization data for one or more block RAMs of the circuit design. The initialization data may be for a plurality of block RAMs organized or structured to behave as a single, larger memory referred to as a memory array. Thus, the system is capable of using memory emulation to modify the configuration bitstream of a circuit design to update and/or modify the initialization data for the memory array. The circuit design need not be re-synthesized to accomplish the updating. The resulting configuration bitstream may then be loaded into a target IC resulting in the block RAMs being initialized, e.g., written, with the updated or modified initialization data.

Using memory emulation facilitates updating of the configuration bitstream in less time compared to other conventional techniques. This results in reduced runtime for the system performing the updating. Use of memory emulation also utilizes less memory within the system to effectuate modification of the configuration bitstream compared to conventional techniques. In addition, memory emulation provides increased flexibility to support different types of block RAMs and different block RAM configurations compared to conventional techniques that rely upon a bottom up approach for updating block RAM initialization data.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example process 100 for generating a memory array emulator. Process 100 is performed by a data processing system (system) such as a computer executing suitable operational software. The system, for example, may execute an operating system and an electronic design automation (EDA) application. An example of such a system is described in connection with FIG. 5.

The system is capable of storing register transfer level (RTL) source 105 and a memory source file 110 within a memory of the system. RTL source 105 is specified as one or more RTL description files. RTL source 105 specifies a circuit design that is to be implemented within an IC. The IC has a particular architecture and is referred to as the "target IC." Memory source file 110 specifies the memory structure(s) used by RTL 105 and the data used to initialize the memory structure(s) referred to herein as "initialization data." Thus, memory source file 110 stores the initialization data for the block RAMs used to implement memory structures within RTL source 105.

As an illustrative example, memory source file 110 is capable of specifying raw data that is transformed into the block RAM(s) contents. Below is an example of raw data excerpted from a memory source file such as memory source file 110. The example illustrates hexadecimal data following an address of "@00000000".

@00000000
B0000000 B8080050 B0000000 B808094C B0000000
 B8080458 00000000 00000000 B0000000 B808042C

The system is capable of performing synthesis 115 on RTL source 105 using memory source file 110. In performing synthesis, the system generates a netlist 120. As part of synthesis 115, the system is capable of creating one or more memory arrays from the block RAMs available on the target IC. The system performs synthesis 115 using RTL source 105 and memory source file 110 to create memory arrays as needed using the available block RAMs of the target IC.

A memory array includes two or more block RAMs. The block RAMs within a memory array may be the same or different. Further, so that the block RAMs of the memory array behave as a single, larger memory, synthesis 115 sets the configuration settings of each block RAM as needed and defines the connectivity among the block RAMs. In this regard, netlist 120 includes memory array attributes 125. Memory array attributes 125 define a particular implementation of the memory array(s) post synthesis. Memory array attributes 125, for example, specify the particular configuration settings of the block RAMs of the target IC that are used to form the memory array(s). Data used to initialize the memory array(s) may be included in netlist 120 or within another file associated with netlist 120.

For example, the target IC includes a variety of different types of block RAMs that may be configured to operate as a single, larger memory called a memory array. Each different type of block RAM has different available configuration settings. One type of block RAM that may be available on the target IC is a RAMB18. A RAMB18 has a variable width data port that may be set to a width of up to 36 bits. Another type of block RAM that may be available on the target IC is a RAMB36. A RAMB36 has a variable width data port that may be set to a width of up to 72 bits.

The size, e.g., number of addresses, of each type of block RAM may be adjusted with the available ranges that differ from one type of block RAM to another. The block RAMs may also be configured for single port or dual port operation, which also influences the number of addresses available and the width of the block RAMs. Similarly, each type of block RAM has data pins, address pins, and/or parity bits that may or may not be used or repurposed depending upon the particular configuration. Each of these parameters may be set as a configuration setting. Memory array attributes 125 may specify, on a per memory array basis, the particular block RAMs that form the memory array, the type of each block RAM, and the configuration settings for the block RAM (e.g., width, addressing, etc.).

For purposes of illustration, several different example memory arrays are described below. The examples provided are not intended to be limiting of the embodiments described herein, but rather to illustrate the heterogeneity of block RAMs of the target IC and the variety of configurations of memory arrays that may be created in synthesis 115 using the available block RAMs of the target IC.

In a first example, a user circuit design specifies a RAM or memory that has 12 k addresses and is 9 bits in width. The RAM may be specified, for example, within RTL source 105. While RTL source 105 describes the RAM in general, RTL source 105 does not specify a particular implementation of the RAM. For example, RTL source 105 does not describe how to form or implement the RAM using block RAMs or other structures available on the target IC.

Continuing with the example, a RAMB18 can be configured to provide 2 k addresses and 9 bits in width. Synthesis 115 is capable of creating a memory array that meets the requirements of the circuit design using six RAMB18s (in depth). Alternatively, synthesis 115 is capable of creating a memory array that uses three RAMB36s, where each provides 4 k addresses and is 9 bits in width. The particular implementation of the memory array may vary based upon other elements of the user circuit design, constraints, and available resources of the target IC. The resulting implementation is specified within memory array attributes 125.

In a second example, the user circuit design may require a dual port RAM of 2 k×64 bits. The RAM may be specified in RTL source 105. In a dual port configuration, each RAMB36 generally provides 32 bits of data and four bits of parity in terms of data width. Accordingly, synthesis 115 may create a memory array meeting these requirements using 4 RAMB36s arranged with 2 RAMB36s (in depth) and 2 RAMB36s (in width). The first RAMB36 in width provides data bits 0-31, while the second RAMB36 in width provides data bits 32-63.

In a third example, the user circuit design may require a dual port RAM of 2 k×36 bits. The RAM may be specified in RTL source 105. In that case, synthesis 115 is capable of creating a memory array meeting these requirements using 2 RAMB36s arranged with 2 RAMB36s (in depth) and 1 RAMB36s (in width). In this example, the RAMB36s are configured to utilize the 4 parity bits as data bits in order to provide the 36 bits in width.

Accordingly, memory array attributes 125 specify configuration settings for block RAMs used for particular implementations of memory array(s) in the circuit design post synthesis. In one aspect, memory array attributes 125 specify or include each block RAM used to form each memory array of netlist 120 and the configuration settings for each memory array (e.g., the configuration settings for each block RAM used to form a memory array of netlist 120). Example configuration settings for a block RAM include, but are not limited to, data usage indicating whether parity bits are used for data, dual port operation or single port operation (port configuration settings), data width, address depth, etc. Connectivity among the block RAMs of a memory array is specified by netlist 120.

In one or more embodiments, netlist 120 is placed and routed. The system is capable of processing netlist 120 through bitstream generation 130 to generate a configuration bitstream 135. Configuration bitstream 135 specifies a placed and routed circuit design that may be loaded into an IC to implement the circuit design specified by RTL source 105 and memory source file 110 (or netlist 120 as the case may be) within the target IC. Configuration bitstream 135 includes the initialization data, e.g., derived from memory source file 110, that is loaded into the various block RAMs of the target IC to initialize the block RAMs including any memory array(s).

The system is capable of performing memory file generation 140. Memory file generation 140 generates a memory attribute file 145. In one aspect, memory attribute file 145 is an alternative representation of memory array attributes 125. The system is also capable of processing memory attribute file 145 through emulator generation 150. Emulator generator 150 uses the memory array attributes within memory attribute file 145 and one or more classes 155 to generate one or more memory array emulator(s) 160.

Memory array emulator 160 emulates operation of a particular implementation of a memory array. The system may generate one memory array emulator 160 for each memory array included in the circuit design. In general, memory array emulator 160 is used for purposes of updating or changing the initialization data for the memory array.

In one aspect, each different type of block RAM is represented by a class 155 in a high level programming language. Thus, each one of classes 155 represents a different type of block RAM available on the target IC. For example, each class is implemented as a data structure that includes data members and functions as members. The functions of a class 155 emulate operations of the particular type of block RAM represented by the class. The functions performed by classes 155 vary based upon the configuration settings of the block RAMs that are emulated.

Each memory array emulator 160 includes emulation objects configured to emulate block RAMs of the memory array being emulated. For example, for a given implementation of a memory array, a one-to-one relationship exists between the block RAMs of the memory array and the emulation objects of the corresponding memory emulator 160 created for the memory array. The emulation objects are instantiated using the particular class 155 corresponding to the type of block RAM emulated by the emulated object. Further, the emulation objects are instantiated using the configuration settings of the block RAM determined from memory array attributes (e.g., from memory attribute file 145). For example, if a memory array emulated by memory array emulator 160 includes two different block RAMs, memory array emulator 160 includes two emulation objects, e.g., one emulation object for each block RAM. Further, if the block RAMs in the memory array include a RAMB18 and a RAMB36, one emulation object is instantiated from the RAMB18 class using the configuration settings of the RAMB18 of the memory array and the other emulation object is instantiated from the RAMB36 class using the configuration settings of the RAMB36 of the memory array.

In each of the example memory arrays described above, data from memory source file 110 that is written to the memory arrays is formatted differently based upon the configuration settings of each individual block RAM included therein. In the example embodiments described herein, each class 155 for a given type of block RAM includes a set of functions adapted to write data and perform operations in the same or similar manner as the particular type of block RAM intended be emulated by that class. The functions are adapted based upon the configuration settings. As such, the functions for a particular class are capable of emulating the operations of the block RAM that is emulated across the different configuration settings available for that type of block RAM.

Figure 2:
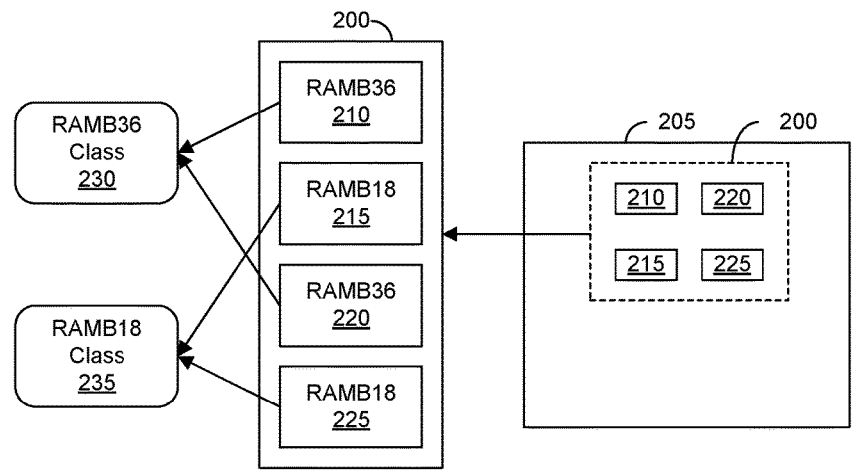
FIG. 2 illustrates an example of a memory array and classes used to create a memory array emulator.

FIG. 2 illustrates an example of a memory array 200 and classes used to create a memory array emulator. Memory array 200 is specified by a circuit design post synthesis by way of the memory array attributes. Memory array 200 is implemented within a target IC 205 upon loading the circuit design, e.g., a configuration bitstream, therein.

In an aspect, target IC 205 is implemented as a programmable IC. As an illustrative example, target IC 205 may be a field programmable gate array (FPGA). In another example, target IC may be an application-specific integrated circuit (ASIC) that includes programmable circuitry. In another example, target IC 205 may be a system-on-chip type of IC that includes programmable circuitry and a processor configured to execute program code. An example of programmable circuitry includes programmable circuit blocks described herein such as FPGA circuitry. For purposes of description, block RAMs are considered programmable circuitry.

In the example of FIG. 2, memory array 200 is formed of four different block RAMs shown as block RAMs 210, 215, 220, and 225. In one aspect, within target IC 205, block RAMs 210-225 may be adjacent tiles. In another aspect, as pictured in FIG. 2, block RAMs 210-225 are not adjacent tiles. Regardless, block RAMs 210-225 are configured to function as a single, larger memory, i.e., memory array 200, post synthesis.

In the example of FIG. 2, block RAMs 210 and 220 are RAMB36 type block RAMs. Block RAMs 215 and 225 are RAMB18 type block RAMs. FIG. 2 illustrates that in generating a memory array emulator for memory array 200, a RAMB36 class 230 and a RAMB18 class 235 are used. In particular, the system, in generating a memory array emulator, creates, or instantiates, a first emulation object representing RAMB36 210 using RAMB36 class 230 and a second emulation object representing RAMB36 220 using RAMB36 class 230. The system further creates, or instantiates, a third object representing RAMB18 215 using RAMB18 class 235 and a fourth object representing RAMB18 225 using RAMB18 class 235.

Figure 3:
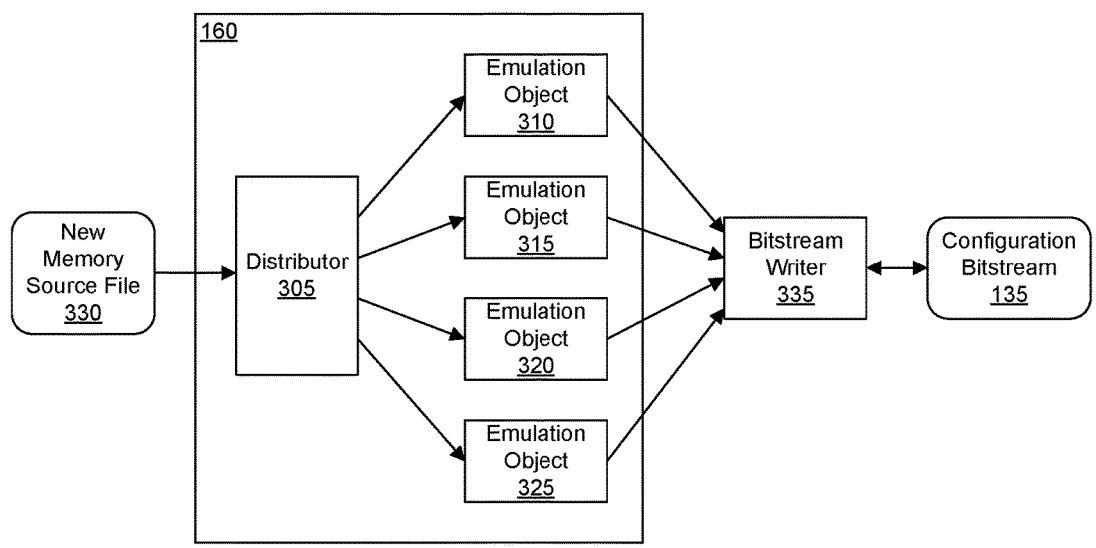
FIG. 3 illustrates an example memory array emulator.

FIG. 3 illustrates an example memory array emulator 160. FIG. 3 illustrates operation, e.g., runtime operation, of memory array emulator 160 after being generated as described in connection with FIG. 1.

For purposes of illustration, memory array emulator 160 is adapted to emulate memory array 200 of FIG. 2. As pictured, memory array emulator 160 includes a distributor 305 and emulation objects 310, 315, 320, and 325. Emulation object 310 emulates operation of RAMB36 210. Emulation object 315 emulates operation of RAMB18 215. Emulation object 320 emulates operation of RAMB36 220. Emulation object 325 emulates operation of RAMB18 225.

Once memory array emulator 160 is generated, the system is capable of executing memory array emulator 160 in order to update configuration bitstream 135. For purposes of illustration, new memory source file 330 includes data used to initialize memory array 200 that has changed since generating configuration bitstream 135. For example, the data within new memory source file 330 is different from the data within memory source file 110 of FIG. 1. Accordingly, in order to change the initialization data that is loaded into memory array 200 upon initializing the target IC, the initialization data within configuration bitstream 135 is to be changed. Memory array emulator 160 is capable of effectuating this change without performing synthesis on the circuit design (RTL source 105) anew or again.

Distributor 305 is capable of reading data from new memory source file 330. In an aspect, distributor 305 is capable of streaming data in from new memory source file 330. The data that is read may include an address within the memory array and content in reference to data actually stored at the address. Distributor 305 is capable of reading initialization data from new memory source file 330 in the form of addresses and content as a data stream. Distributor 305 routes portions of the streamed data to emulation object 310, emulation object 315, emulation object 320, or emulation object 325 based upon the address(es).

For example, based upon the structure of memory array 200 as implemented, each block RAM includes a range of addresses, e.g., a subset of addresses, of the larger memory array. Similarly, each of emulation objects 310-325, representing one of block RAMs 210-225, includes a range of addresses. For example, emulation object 310 emulates, e.g., has, the same range or subset of addresses as block RAM 210. Emulation object 315 emulates, e.g., has, the same range or subset of addresses as block RAM 215, etc. Thus, distributor 305, being aware of the addressing implemented by emulation objects 310-325, routes portions of the streamed data corresponding to addresses implemented in block RAM 210 to emulation object 310. Distributor 305 routes portions of the streamed data for block RAM 215 to emulation object 315. Distributor 305 routes portions of the streamed data for block RAM 220 to emulation object 320. Distributor 305 routes portions of the streamed data for block RAM 225 to emulation object 325.

Each of emulation objects 310, 315, 320, and 325, in response to receiving the portions of streamed data, processes the data and stores the data in a format that is determined based upon the particular configuration settings in effect for the emulation object (and the particular block RAM emulated by the object). For example, data is stored in a location within the emulation object corresponding to the address specified for the received data. The emulation object formats the data to have a width conforming to the width of the block RAM emulated by the emulation object. The emulation object uses parity bits or not for storing the data based upon the configuration settings of the block RAM emulated by the emulation object, etc. In general, each of emulation objects 310-325 stores data in the same way and format as the particular block RAM that is emulated by the emulation object.

Once the data from memory attribute file 330 is fully streamed into memory array emulator 160, each of emulation objects 310-325 stores the initialization data needed for the block RAM represented by the respective emulation object. That is, emulation object 310 stores the initialization data for block RAM 210. Emulation object 315 stores the initialization data for block RAM 215, etc. The initialization data in each of emulation objects 310-315 is formatted in the same way that the data would be stored in the actual, physical block RAM.

In one or more embodiments, each of emulation objects 310-325 is configured to generate and write initialization strings using the received portions of streamed data. For example, an object such as emulation object 310 receives portions of the streamed data to be stored therein from distributor 305 based upon the address of the data. In one aspect, emulation object receives data in the form of address and data item pairs. Emulation object 310 is configured to format the data based upon the configuration of block RAM 210. The format converted data stored in emulation object 310 at the address is initialization data for block RAM 210. In one aspect, the initialization data is stored as one or more initialization strings. Emulation objects 315-325 are capable of operating in the same manner as emulation object 310.

Emulation objects 310-325 are capable of providing an application programming interface used by a bitstream writer 335. In an aspect, emulation objects 310, 315, 320, and 325 are configured to communicate with the bitstream writer 335 to provide the initialization data from each respective object. For example, bitstream writer 335 is capable of communicating with emulation objects 310-325 to obtain the initialization strings from each respective emulation object. Bitstream writer 335 is capable of reading and updating configuration bitstream 135 with the initialization data, e.g., initialization strings, obtained from initialization strings objects 310-325.

In one or more embodiments, each block RAM represented by an emulation object 310, 315, 320, or 325 has an identifier. In one aspect, the identifier is a coordinate of the block RAM on the target IC. The coordinate may be an (x, y) coordinate on the target IC. The identifier is included in the corresponding emulation object. Bitstream writer 335 obtains the identifier, e.g., the coordinate, for an emulation object and the initialization strings from the emulation object. Bitstream writer 335 is capable of determines where within configuration bitstream 135 the initialization strings are to be written based upon the identifier of the particular emulation object from which the initialization strings are obtained.

Figure 4:
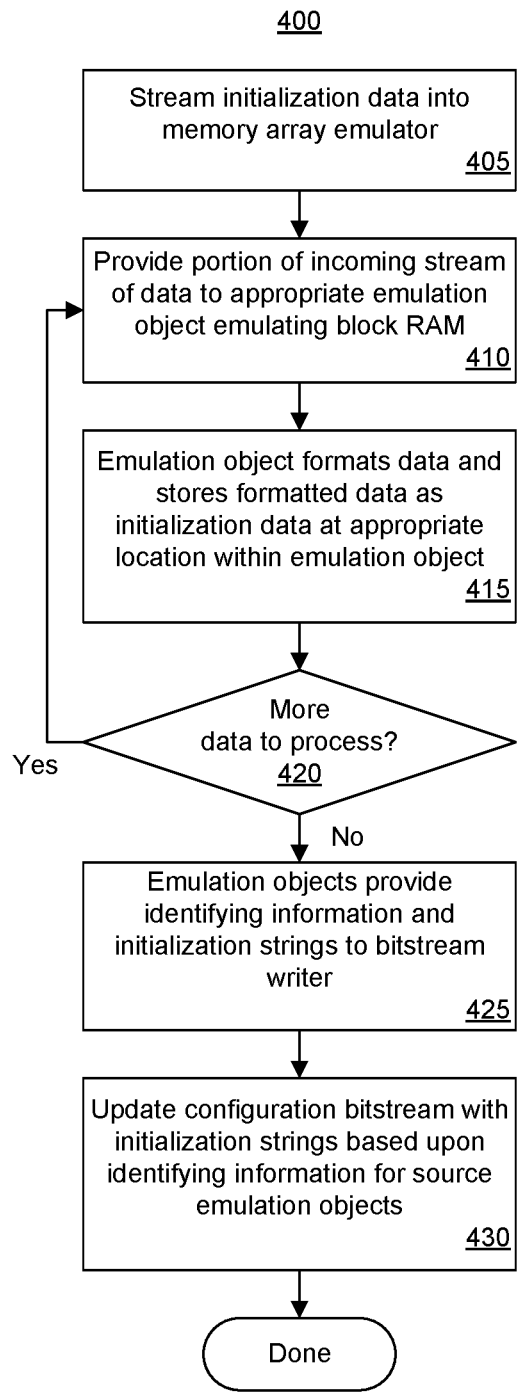
FIG. 4 illustrates a method of modifying initialization data for a memory array within a configuration bitstream.

FIG. 4 illustrates a method 400 of modifying initialization data for a memory array within a configuration bitstream. Method 400 may be performed by a system as described herein using memory emulation. While particular operations described in connection with the example of FIG. 4 may be attributed to particular elements of the memory array emulator or other program code, it should be appreciated that the processor of the system performs the operations described by executing the program code or element noted.

Method 400 may begin in a state where a memory array emulator has been created to emulate a memory array of a circuit design. A configuration bitstream exists for the circuit design and is to be modified or updated to include different initialization data for the memory array emulated by the memory array emulator. For purposes of discussion, method 400 illustrates the case of a single memory array. It should be appreciated, however, that method 400 may be performed for each different memory array included in the circuit design for which initialization data is changed. Further, each such memory array would have a corresponding memory array emulator specific to the post synthesis implementation of that memory array.

In block 405, the system streams initialization data into the memory array emulator from a data source. For example, the distributor reads data from the data source as streamed data using streamed I/O. The data source may be a file stored in memory or another data structure specifying different data than what is currently used in the configuration bitstream for initializing the memory array. The data source, for example, may be a new memory source file.

In block 410, the system provides a portion of the incoming stream of data to an emulation object emulating a block RAM of the memory array. In one aspect, the portion of data that is provided to the emulation object includes an address and content (e.g., a data item) to be written at the address. The distributor is capable of processing the incoming stream of data and reading the addresses or an initially provided address as the case may be.

In one aspect, the distributor is configured to include a mapping of address ranges to emulation objects for each of the emulation objects emulating a block RAM of the memory array. The distributor is capable of determining the particular emulation object to which the portion of initialization data is to be written using the address specified within the portion of data or the address determined for the portion of data by the distributor (e.g., from an initially specified start address). Accordingly, based upon the address, the distributor is capable of routing the portion of data to the emulation object having an address range including the address of the portion of data. For example, the distributor is capable of writing the portion of data to the emulation object with an address range including the address specified and/or determined for the portion of data.

In block 415, the emulation object formats the portion of initialization data provided in block 410 from the distributor. The emulation object is also capable of storing the formatted portion of data as initialization data at a selected location within the emulation object. For example, the emulation object is capable of generating an initialization string using the content of the data from the distributor. The particular format of the initialization string is based upon the configuration settings of the block RAM emulated by the emulation object. Further, the selected location within the emulation object where the initialization string is stored is a location that corresponds to the address received from the distributor for the data.

In block 420, the system determines whether any further data remains to be processed from the data source. If so, method 400 loops back to block 410 to continue processing. If not, method 400 continues to block 425.

In block 425, the emulation objects provide identifying information and the initialization data to the bitstream writer. For example, each emulation object is capable of providing an identifier of the particular block RAM emulated by the emulation object and the initialization strings generated and stored in the emulation object to the bitstream writer. In one or more embodiments, the identifying information for the emulation object is the (x, y) coordinate of the block RAM (on the target IC) that is emulated by the emulation object. Each of the emulation objects emulating a block RAM of the memory array is capable of providing identifying information and the initialization strings contained therein to the bitstream writer.

In block 430, the bitstream writer reads in an existing configuration bitstream for the circuit design and updates the configuration bitstream with the initialization strings received from the emulation objects. The bitstream writer is capable of determining where the initialization strings are to be written within the configuration bitstream based upon the identifying information provided from each of the respective emulation objects. For example, for a given emulation object that is the source of a plurality of initialization strings, the bitstream writer is capable of determining which portions of the configuration bitstream to overwrite with the initialization strings using the (x, y) coordinate provided from the source emulation object. The "source emulation object" is the particular emulation object that provides an initialization string written to the configuration bitstream.

Figure 5:
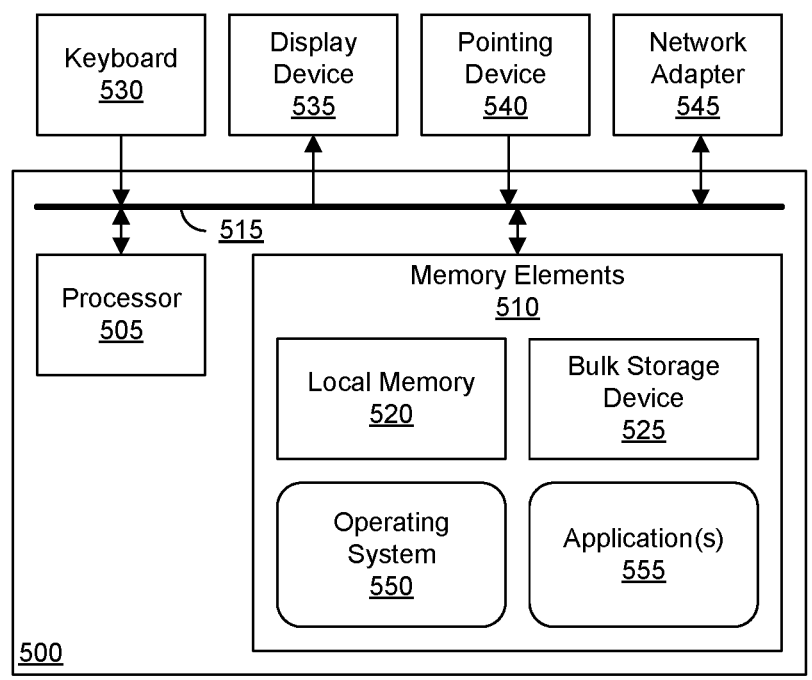
FIG. 5 illustrates an example data processing system for use with the inventive arrangements described herein.

FIG. 5 illustrates an example architecture 500 for a data processing system (system) as described herein in connection with FIGS. 1-4. Architecture 500 includes at least one processor, e.g., a central processing unit (CPU), 505 coupled to memory elements 510 through interface circuitry 515.

Architecture 500 stores program code within memory elements 510. Processor 505 executes the program code accessed from memory elements 510 via interface circuitry 515. In one aspect, architecture 500 is implemented as a computer or other data processing system that is suitable for storing and/or executing program code. It should be appreciated, however, that architecture 500 can be implemented in the form of any system including a processor and memory that is capable of performing the functions described within this disclosure.

Memory elements 510 include one or more physical memory devices such as, for example, a local memory 520 and one or more bulk storage devices 525. Local memory 520 refers to RAM or other non-persistent memory device(s) generally used during actual execution of the program code. Bulk storage device 525 may be implemented as a hard disk drive (HDD), solid state drive (SSD), or other persistent data storage device. Architecture 500 may also include one or more cache memories (not shown) that provide temporary storage of at least some program code in order to reduce the number of times program code must be retrieved from bulk storage device 525 during execution.

Examples of interface circuitry 515 include, but are not limited to, an input/output (I/O) subsystem, an I/O interface, a bus system, a memory interface, etc. For example, interface circuitry 515 may be one or more of any of several types of bus structures, including a memory bus or memory controller, a peripheral bus, an accelerated graphics port, and a processor or local bus using any of a variety of bus architectures. By way of example, and not limitation, such bus architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Input/output (I/O) devices such as a keyboard 530, a display device 535, a pointing device 540, a network adapter 545, etc., may optionally be coupled to architecture 500. The I/O devices may be coupled to architecture 500 either directly or through intervening I/O controllers. Network adapter 545 enables a system implemented using architecture 500 to become coupled to other systems, computer systems, remote printers, and/or remote storage devices through intervening private or public networks. Modems, cable modems, Ethernet cards, and wireless transceivers are examples of different types of network adapter 545 that may be used with architecture 500. It should be appreciated that architecture 500 may include other I/O devices such as one or more communication ports.

Memory elements 510 store one or more program modules. The program modules may generally include routines, programs, objects, components, logic, data embodied within memory elements 510 (e.g., as data structures), and so on. For purposes of illustration, memory elements 510 are shown to store an operating system 550 and one or more application(s) 555. In one or more embodiments, application(s) 555 include an EDA application, a memory array emulator, a bitstream generator, a bitstream writer, and/or any combination thereof. In one aspect, operating system 550 and application(s) 555, being implemented in the form of executable program code, are executed by architecture 500 and, more particularly, by processor 505, to perform the operations described within this disclosure. As such, operating system 550 and application(s) 555 may be considered an integrated part of architecture 500.

Any data used, generated, and/or operated upon by a system using architecture 500 or an architecture similar thereto for updating initialization data for block RAMs as described herein are functional data structures that impart functionality when employed as part of the system. A data structure refers to a physical implementation of a data model's organization of data within a physical memory. As such, a data structure is formed of specific electrical or magnetic structural elements in a memory. A data structure imposes physical organization on the data stored in the memory as used by a processor.

Architecture 500 may include fewer components than shown or additional components not illustrated in FIG. 5 depending upon the particular type of device that is implemented. In addition, the particular operating system and/or application(s) included may vary according to device type as may the types of network adapter(s) included. Further, one or more of the illustrative components may be incorporated into, or otherwise form a portion of, another component. For example, a processor may include at least some memory.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the terms "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without user intervention. As defined herein, the term "user" means a human being. As defined herein, the term "output" means storing in physical memory elements, e.g., devices, writing to display or other peripheral output device, sending or transmitting to another system, exporting, or the like.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. Memory elements, as described herein, are examples of a computer readable storage medium. A non-exhaustive list of more specific examples of a computer readable storage medium may include: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing.

As defined herein, the term "high level programming language" means a programming language, or set of instructions, used to program a data processing system where the instructions have a strong abstraction from the details of the data processing system. In one aspect, a high level programming language includes natural language elements. In another aspect, a high level programming language automates or hides aspects of operation of the data processing system such as memory management, processor register usage, and other low level operations. A high level programming language, for example, may have little or no instructions that translate directly, on a one-to-one basis, into a native opcode of a data processing system. Examples of high level programming languages include, but are not limited to, C, C++, SystemC, OpenCL, or the like.

As defined herein, the terms "one embodiment," "an embodiment," or similar language mean that a particular feature, structure, or characteristic described in connection with the embodiment is included in at least one embodiment described within this disclosure. Thus, appearances of the phrases "in one embodiment," "in an embodiment," and similar language throughout this disclosure may, but do not necessarily, all refer to the same embodiment.

As defined herein, the term "processor" means at least one hardware circuit configured to carry out instructions contained in program code. The hardware circuit may be an integrated circuit. Examples of a processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, a graphics processing unit (GPU), a controller, and so forth.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

One or more embodiments are directed to methods of modifying initialization data for a memory array of a circuit design. In one aspect, a method can include providing, using a processor, portions of an incoming stream of data for initializing the memory array to emulation objects of a memory array emulator. The memory array emulator is configured to emulate an implementation of the memory array and the emulation objects represent block random access memories (block RAMs) of the memory array. The method can include formatting, using the processor, the data using the emulation objects to generate initialization data, wherein the data is formatted based upon configuration settings of the block RAMs emulated by the respective emulation objects. The method can also include updating, using the processor, a configuration bitstream with the initialization data.

In one aspect, different types of the block RAMs are represented by different classes in a high level programming language, wherein the emulation object representing each block RAM of the memory array is an instantiation of the class representing the type of block RAM emulated by the emulation object.

In another aspect, each emulation object of the memory array emulator generates initialization strings formatted based upon the configuration setting of the block RAM represented by the emulation object, wherein the initialization data is formed of the initialization strings.

In another aspect, each emulation object of the memory array emulator outputs the initialization strings and an identifier of the block RAM emulated by the emulation object.

In another aspect, the identifier is a coordinate of the block RAM emulated by the emulation object, wherein the initialization strings are written to the configuration bitstream based upon the coordinate.

In another aspect, the portions of data are provided to the emulation objects based upon an address of each portion of data and an address range for each of the emulation objects, wherein the address range of each emulation object corresponds to an address range of the block RAM emulated by the emulation object.

In another aspect, the data is formatted by the emulation objects to generate initialization data based upon data usage configuration settings of the block RAMs.

In another aspect, the data is formatted by the emulation objects to generate initialization data based upon data width configuration settings of the block RAMs and address depth configuration settings of the block RAMs.

In another aspect, the data is formatted by the emulation objects to generate initialization data based upon port configuration settings of the block RAMs.

One or more embodiments are directed to systems for modifying initialization data for a memory array of a circuit design. In one aspect, a system includes a processor configured to initiate executable operations. The executable operations include providing portions of an incoming stream of data for initializing the memory array to emulation objects of a memory array emulator. The memory array emulator is configured to emulate an implementation of the memory array and the emulation objects represent block RAMs of the memory array. The executable operations can include formatting the data using the emulation objects to generate initialization data, wherein the data is formatted based upon configuration settings of the block RAMs emulated by the respective emulation objects. The executable operations can also include updating a configuration bitstream with the initialization data.

In one aspect, different types of the block RAMs are represented by different classes in a high level programming language, wherein the emulation object representing each block RAM of the memory array is an instantiation of the class representing the type of block RAM emulated by the emulation object.

In another aspect, each emulation object of the memory array emulator generates initialization strings formatted based upon the configuration setting of the block RAM represented by the emulation object, wherein the initialization data is formed of the initialization strings.

In another aspect, each emulation object of the memory array emulator outputs the initialization strings and an identifier of the block RAM emulated by the emulation object.

In another aspect, the identifier is a coordinate of the block RAM emulated by the emulation object, wherein the initialization strings are written to the configuration bitstream based upon the coordinate.

In another aspect, the portions of data are provided to the emulation objects based upon an address of each portion of data and an address range for each of the emulation objects, wherein the address range of each emulation object corresponds to an address range of the block RAM emulated by the emulation object.

In another aspect, the data is formatted by the emulation objects to generate initialization data based upon data usage configuration settings of the block RAMs.

In another aspect, the data is formatted by the emulation objects to generate initialization data based upon data width configuration settings of the block RAMs and depth configuration settings of the block RAMs.

In another aspect, the data is formatted by the emulation objects to generate initialization data based upon port configuration settings of the block RAMs.

One or more embodiments are directed to computer program products for modifying initialization data for a memory array of a circuit design. In one aspect, a computer program product includes a computer readable storage medium having program instructions embodied therewith. The program instructions are executable by a processor to cause the processor to initiate operations including providing, using the processor, portions of an incoming stream of data for initializing the memory array to emulation objects of a memory array emulator. The memory array emulator is configured to emulate an implementation of the memory array and the emulation objects represent block RAMs of the memory array. The program instructions are executable to cause the processor to initiate operations including formatting, using the processor, the data using the emulation objects to generate initialization data, wherein the data is formatted based upon configuration settings of the block RAMs emulated by the respective emulation objects, and updating, using the processor, a configuration bitstream with the initialization data.

In one aspect, different types of the block RAMs are represented by different classes in a high level programming language, wherein the emulation object representing each block RAM of the memory array is an instantiation of the class representing the type of block RAM emulated by the emulation object.

In another aspect, each emulation object of the memory array emulator generates initialization strings formatted based upon the configuration setting of the block RAM represented by the emulation object, wherein the initialization data is formed of the initialization strings.

In another aspect, each emulation object of the memory array emulator outputs the initialization strings and an identifier of the block RAM emulated by the emulation object.

In another aspect, the identifier is a coordinate of the block RAM emulated by the emulation object, wherein the initialization strings are written to the configuration bitstream based upon the coordinate.

In another aspect, the portions of data are provided to the emulation objects based upon an address of each portion of data and an address range for each of the emulation objects, wherein the address range of each emulation object corresponds to an address range of the block RAM emulated by the emulation object.

In another aspect, the data is formatted by the emulation objects to generate initialization data based upon data usage configuration settings of the block RAMs.

In another aspect, the data is formatted by the emulation objects to generate initialization data based upon data width configuration settings of the block RAMs and depth configuration settings of the block RAMs.

In another aspect, the data is formatted by the emulation objects to generate initialization data based upon port configuration settings of the block RAMs.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method of modifying initialization data for a memory array of a circuit design, the method comprising:
   providing, using a processor, portions of an incoming stream of data for initializing a memory array to emulation objects of a memory array emulator;
   wherein the memory array emulator is configured to emulate an implementation of the memory array and the emulation objects represent block random access memories (block RAMs) of the memory array;
   formatting, using the processor, the data using the emulation objects to generate initialization data, wherein the data is formatted based upon configuration settings of the block RAMs emulated by the respective emulation objects; and
   updating, using the processor, a configuration bitstream with the initialization data.

2. The method of claim 1, wherein different types of the block RAMs are represented by different classes in a high level programming language, wherein the emulation object representing each block RAM of the memory array is an instantiation of the class representing the type of block RAM emulated by the emulation object.

3. The method of claim 1, wherein each emulation object of the memory array emulator generates initialization strings formatted based upon the configuration setting of the block RAM represented by the emulation object, wherein the initialization data is formed of the initialization strings.

4. The method of claim 3, wherein each emulation object of the memory array emulator outputs the initialization strings and an identifier of the block RAM emulated by the emulation object.

5. The method of claim 4, wherein the identifier is a coordinate of the block RAM emulated by the emulation object, wherein the initialization strings are written to the configuration bitstream based upon the coordinate.

6. The method of claim 1, wherein the portions of data are provided to the emulation objects based upon an address of each portion of data and an address range for each of the emulation objects, wherein the address range of each emulation object corresponds to an address range of the block RAM emulated by the emulation object.

7. The method of claim 1, wherein the data is formatted by the emulation objects to generate initialization data based upon data usage configuration settings of the block RAMs.

8. The method of claim 1, wherein the data is formatted by the emulation objects to generate initialization data based upon data width configuration settings of the block RAMs and address depth configuration settings of the block RAMs.

9. The method of claim 1, wherein the data is formatted by the emulation objects to generate initialization data based upon port configuration settings of the block RAMs.

10. A system for modifying initialization data for a memory array of a circuit design, the system comprising:
    a processor configured to initiate executable operations including:
    providing portions of an incoming stream of data for initializing a memory array to emulation objects of a memory array emulator;
    wherein the memory array emulator is configured to emulate an implementation of the memory array and the emulation objects represent block random access memories (block RAMs) of the memory array;
    formatting the data using the emulation objects to generate initialization data, wherein the data is formatted based upon configuration settings of the block RAMs emulated by the respective emulation objects; and
    updating a configuration bitstream with the initialization data.

11. The system of claim 10, wherein different types of the block RAMs are represented by different classes in a high level programming language, wherein the emulation object representing each block RAM of the memory array is an instantiation of the class representing the type of block RAM emulated by the emulation object.

12. The system of claim 10, wherein each emulation object of the memory array emulator generates initialization strings formatted based upon the configuration setting of the block RAM represented by the emulation object, wherein the initialization data is formed of the initialization strings.

13. The system of claim 12, wherein each emulation object of the memory array emulator outputs the initialization strings and an identifier of the block RAM emulated by the emulation object.

14. The system of claim 13, wherein the identifier is a coordinate of the block RAM emulated by the emulation object, wherein the initialization strings are written to the configuration bitstream based upon the coordinate.

15. The system of claim 10, wherein the portions of data are provided to the emulation objects based upon an address of each portion of data and an address range for each of the emulation objects, wherein the address range of each emulation object corresponds to an address range of the block RAM emulated by the emulation object.

16. The system of claim 10, wherein the data is formatted by the emulation objects to generate initialization data based upon data usage configuration settings of the block RAMs.

17. The system of claim 10, wherein the data is formatted by the emulation objects to generate initialization data based upon data width configuration settings of the block RAMs and depth configuration settings of the block RAMs.

18. The system of claim 10, wherein the data is formatted by the emulation objects to generate initialization data based upon port configuration settings of the block RAMs.

19. A computer program product for modifying initialization data for a memory array of a circuit design, the computer program product comprising a computer readable storage medium having program instructions embodied therewith, the program instructions executable by a processor to cause the processor to initiate operations comprising:
- providing, using the processor, portions of an incoming stream of data for initializing a memory array to emulation objects of a memory array emulator;
- wherein the memory array emulator is configured to emulate an implementation of the memory array and the emulation objects represent block random access memories (block RAMs) of the memory array;
- formatting, using the processor, the data using the emulation objects to generate initialization data, wherein the data is formatted based upon configuration settings of the block RAMs emulated by the respective emulation objects; and
- updating, using the processor, a configuration bitstream with the initialization data.

20. The computer program product of claim 19, wherein each emulation object of the memory array emulator generates initialization strings formatted based upon the configuration setting of the block RAM represented by the emulation object, wherein the initialization data is formed of the initialization strings.

\* \* \* \* \*